(12) United States Patent
Dube et al.

(10) Patent No.: US 8,378,424 B2
(45) Date of Patent: Feb. 19, 2013

(54) SEMICONDUCTOR STRUCTURE HAVING TEST AND TRANSISTOR STRUCTURES

(75) Inventors: Abhishek Dube, Fishkill, NY (US);
Viorel Ontalus, Danbury, CT (US);
Kathryn T. Schonenberg, Wappingers Falls, NY (US); Zhengmao Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/599,573

(22) Filed: Aug. 30, 2012

(65) Prior Publication Data
US 2012/0319110 A1 Dec. 20, 2012

Related U.S. Application Data

(62) Division of application No. 13/075,450, filed on Mar. 30, 2011.

(51) Int. Cl.
*H01L 29/66* (2006.01)
(52) U.S. Cl. .... 257/365; 438/492; 257/48; 257/E21.409
(58) Field of Classification Search .................. 257/365, 257/366, 48; 438/492, 494, 495, 498, 504, 438/505, 507, 508
See application file for complete search history.

(56) References Cited

U.S. PATENT DOCUMENTS

| 7,067,855 | B2 | 6/2006 | Cardone et al. |
| 7,279,368 | B2 | 10/2007 | Harris et al. |
| 7,320,922 | B2 | 1/2008 | Bromberger |
| 7,510,925 | B2 | 3/2009 | Miyanami |
| 7,834,394 | B2 | 11/2010 | Lin |
| 7,863,680 | B2 | 1/2011 | Zundel et al. |
| 2010/0320546 | A1 | 12/2010 | Tamura |
| 2011/0287600 | A1 | 11/2011 | Cheng et al. |
| 2012/0112280 | A1 | 5/2012 | Johnson et al. |

OTHER PUBLICATIONS

U.S. Appl. No. 13/075,450, filed Mar. 30, 2011, Notice of Allowance and Fees Due dated Aug. 13, 2012.

*Primary Examiner* — Charles Garber
*Assistant Examiner* — Reema Patel
(74) *Attorney, Agent, or Firm* — Katherine S. Brown; Hoffman Warnick LLC

(57) ABSTRACT

A semiconductor substrate having transistor structures and test structures with spacing between the transistor structures smaller than the spacing between the test structures is provided. A first iteratively performed deposition and etch process includes: depositing a first doped epitaxial layer having a first concentration of a dopant over the semiconductor substrate, and etching the first doped epitaxial layer. A second iteratively performed deposition and etch process includes: depositing a second doped epitaxial layer having a second concentration of the dopant higher than the first concentration over the semiconductor substrate, and etching the second doped epitaxial layer. The first concentration results in a first net growth rate over the transistor structures and the second concentration results in a lower, second net growth rate over the test structures than the transistor structures, resulting in reduced pattern loading.

4 Claims, 6 Drawing Sheets

US 8,378,424 B2

SEMICONDUCTOR STRUCTURE HAVING TEST AND TRANSISTOR STRUCTURES

CROSS-REFERENCE TO RELATED APPLICATIONS

This application is a divisional of U.S. patent application Ser. No. 13/075,450, filed on Mar. 30, 2011, currently pending and hereby incorporated by reference in its entirety.

BACKGROUND

1. Technical Field

The disclosure relates generally to semiconductor fabrication, and more particularly, to a method of forming for reducing pattern loading for a doped epitaxial process and a resulting semiconductor structure.

2. Background Art

Epitaxial layers or films are used in a wide variety of semiconductor devices. For example, epitaxial layers are advantageous in p-type field effect transistors (PFETs) using silicon germanium substrates in which parasitic features require doping with phosphorous and carbon, or arsenic and carbon, to create the appropriate compressive strain over the source/drain regions in the substrate. In order to create epitaxial layers having adequate defect-free thicknesses at current technology nodes, e.g., the 22 nm node, an iterative deposition and etching process is used. During deposition of the epitaxial layer, only a certain thickness grows defect free, e.g., 50-100 Angstroms (Å). After a thickness beyond that defect-free amount has been deposited, an etch process is used to remove any defective thickness. This process is repeated, for example, 20-30 times to achieve the target thickness.

One challenge with this process, as illustrated in FIG. 1, is that it results in very large differences in thicknesses of the epitaxial layers between the smallest features (T1) on a substrate which may be, e.g., D=1-2 nanometers, apart, and the largest features on the substrate (T2) which may be, e.g., nD=7-9 nanometers, apart. This problem is referred to as "pattern loading" due to the different thickness growth based on different substrate feature patterns. The difference in thickness may be as much as, for example, 25%. As a result of this situation, a minimum feature size exists, e.g., D=800 Angstroms, at which this process cannot be used due to the inability to create an adequately uniform thickness of epitaxial layer across the substrate. For example, the minimum feature size may be based on what is necessary or proper for downstream processing such as replacement metal gate (RMG) processing. In this case, the epitaxial layers have an upper limit on the thickness anywhere on the wafer to avoid encroachment of the source-drain regions during polysilicon or other dummy gate material removal from a gate area that will be later re-filled with a metal.

BRIEF SUMMARY

A first aspect of the disclosure provides a method comprising: providing a semiconductor substrate having transistor structures and test structures, wherein spacing between the transistor structures is smaller than spacing between the test structures; first iteratively performing a deposition and etch process including: depositing a first doped epitaxial layer over the semiconductor substrate, the first doped epitaxial layer having a first concentration of a dopant, and etching the first doped epitaxial layer; and second iteratively performing a deposition and etch process including: depositing a second doped epitaxial layer over the semiconductor substrate, the second doped epitaxial layer having a second concentration of the dopant that is higher than the first concentration, and etching the second doped epitaxial layer, wherein the first concentration results in a first net growth rate over the transistor structures and the second concentration results in a lower, second net growth rate over the test structures than the transistor structures.

A second aspect of the disclosure provides a method comprising: providing a semiconductor substrate having transistor structures and test structures, wherein a spacing between the transistor structures is smaller than a spacing between the test structures; controlling pattern loading between the transistor structures and the test structures by: performing a first iteration of: depositing a first doped epitaxial layer over the semiconductor substrate, the first doped epitaxial layer having a first concentration of a dopant, and etching the first doped epitaxial layer; and performing a second iteration of: depositing a second doped epitaxial layer over the semiconductor substrate, the second doped epitaxial layer having a second concentration of the dopant that is higher than the first concentration, and etching the second doped epitaxial layer, wherein the first and second iterations result in a lower deposition rate over the test structures than a deposition rate over the transistor structure, and a higher etch rate over the test structures compared to the test structures.

A third aspect of the disclosure provides a semiconductor structure comprising: a first embedded region between a pair of adjacent transistor structures, the first embedded region having a first doped epitaxial layer having a first concentration of a dopant over a bottom and sidewalls of the first embedded region and a second doped epitaxial layer having a second, higher concentration of the dopant over the first doped epitaxial layer; and a second embedded region between a pair of adjacent test structures, the second embedded region having the first doped epitaxial layer over the bottom and sidewalls of the second embedded region and the second doped epitaxial layer over the first doped epitaxial layer, wherein the second embedded region is larger than the first embedded region, and a difference in thickness of the first and second epitaxial layers together between the transistor structures compared to that between the test structures is no greater than approximately 10%.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
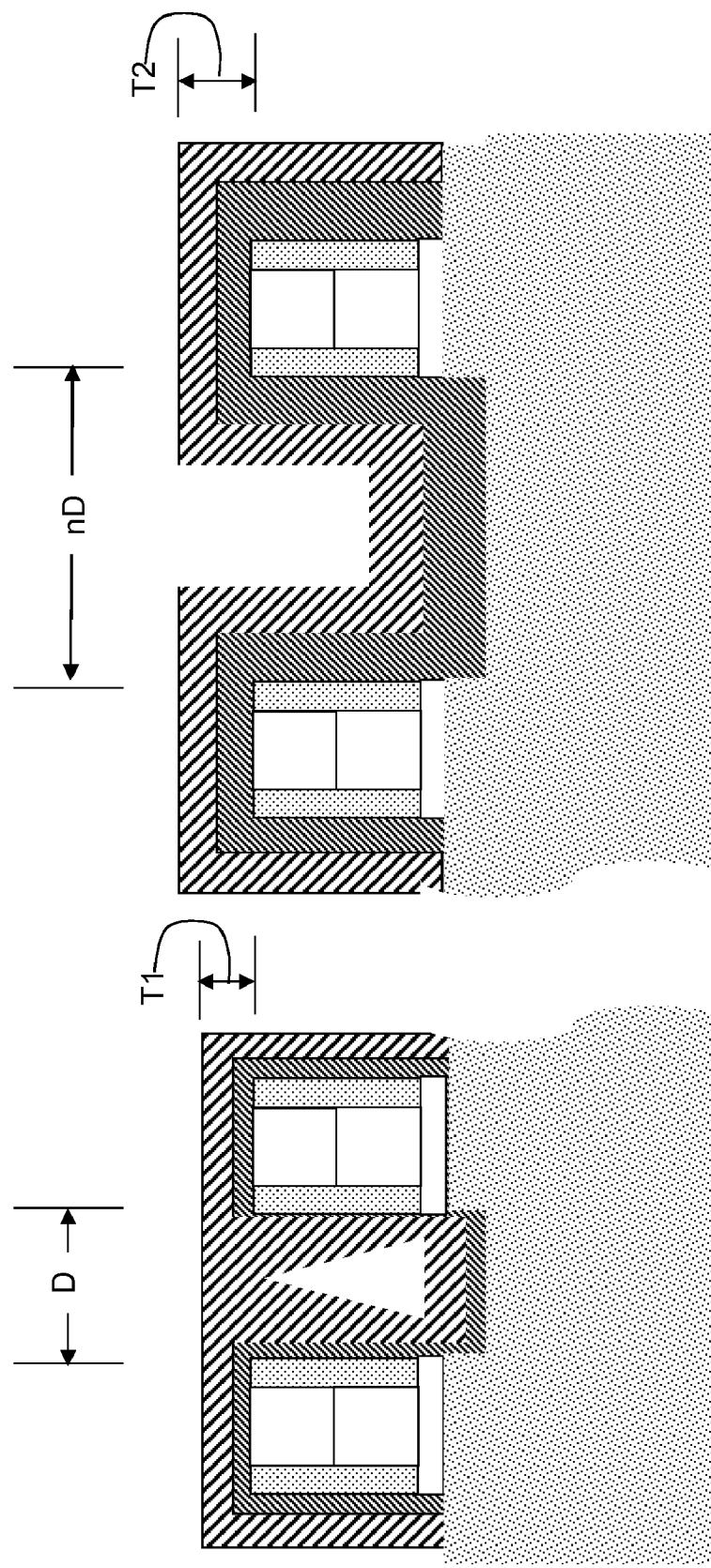
FIG. 1 shows a cross-sectional view of a conventional semiconductor substrate.
Figure 2:
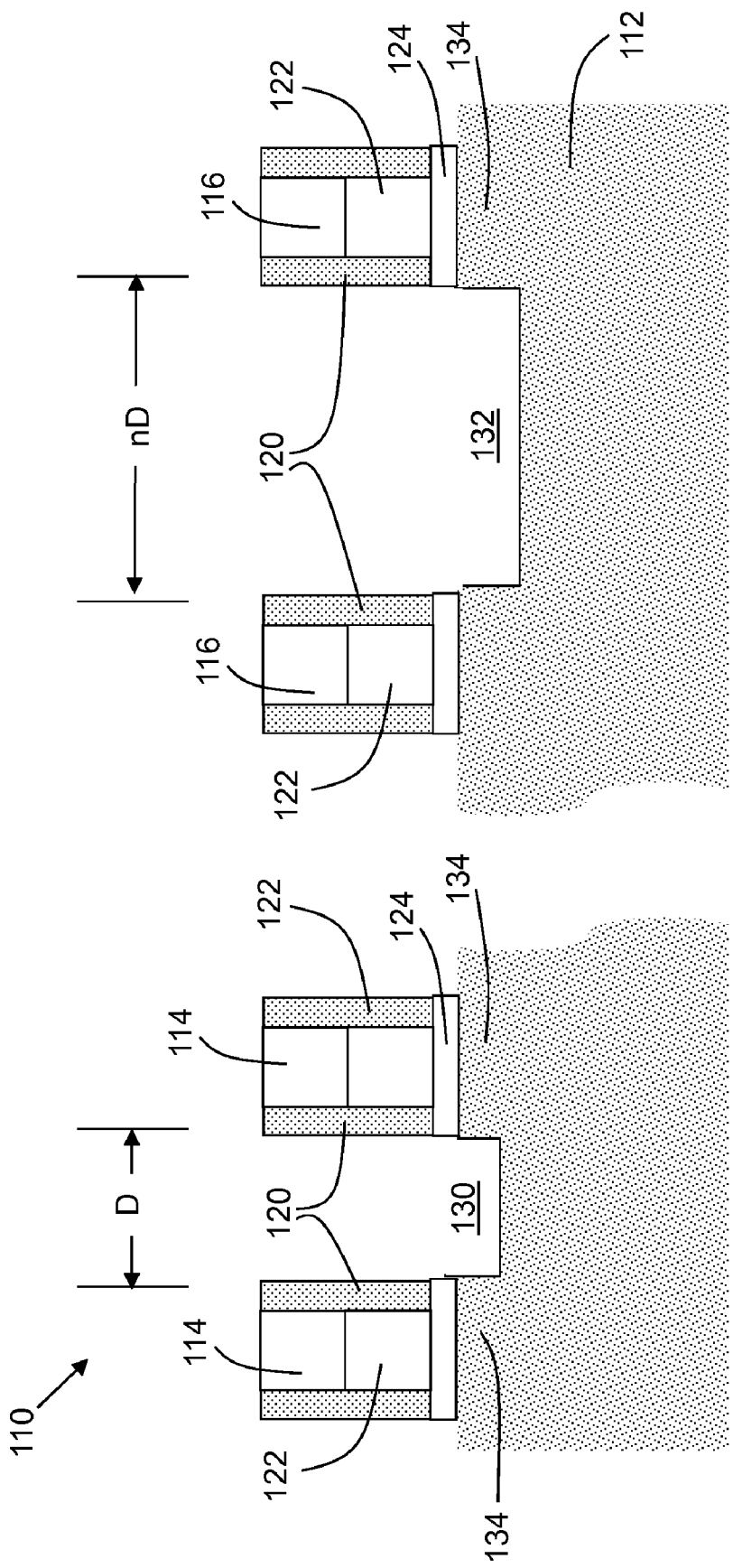
FIGS. 2-6 show cross-sectional views of various embodiments of a method according to the invention, with FIG. 6 showing a resulting semiconductor structure.

As indicated above, the disclosure provides methods for controlling and/or reducing pattern loading between transistor structures and test structures for a doped epitaxial process. Referring to the drawings, FIG. 2 shows a cross-sectional view of a preliminary structure 110 that is provided using any now known or later developed fabrication techniques. Structure 110 may include, for example, a semiconductor substrate 112. Substrate 112 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Structure 110 may also have transistor structures 114 and test structures 116 formed thereon. Transistor structures 114 and test structure 116 may include any now known or later developed transistor devices either in final or some intermediate form. Transistor structures 114 may be actual devices that will be functional in the integrated circuit, while test structures 116 are constructed substantially identically with transistor structures but are used for testing, non-operational purposes. As shown in FIG. 2, via the split in substrate 112, transistor structures 114 and test structures 116 are typically formed on different locations on the substrate. The distance between structures 114, 116 may be user defined. Test structures 116 may be formed, for example, in a testing area referred to as a SIMS pad, e.g., a 200×200 μm sized area of the wafer. As indicated by the dimension markings, a spacing D between transistor structures 114 is smaller than a spacing nD between test structures 116. In one example, spacing nD is a multiple n of spacing D. The spacings D, nD may be determined based on any selected element of structures 114, 116. In the example shown, spacings D, nD are indicated as between adjacent spacers 120 of adjacent structures 114, 116. The spacings may also be determined between adjacent surfaces of another selected element of structures 114, 116, e.g., gates 122, gate dielectric layers 124, etc.

Each pair of adjacent structures 114, 116 also includes an embedded region 130, 132, respectively, that is contiguous with the space therebetween and into which a doped epitaxial layer according to embodiments of the invention will be formed. Doped epitaxial layers may be formed to provide, for example, a source/drain region and strain to channel regions 134 of each structure 114, 116.

Figure 3:
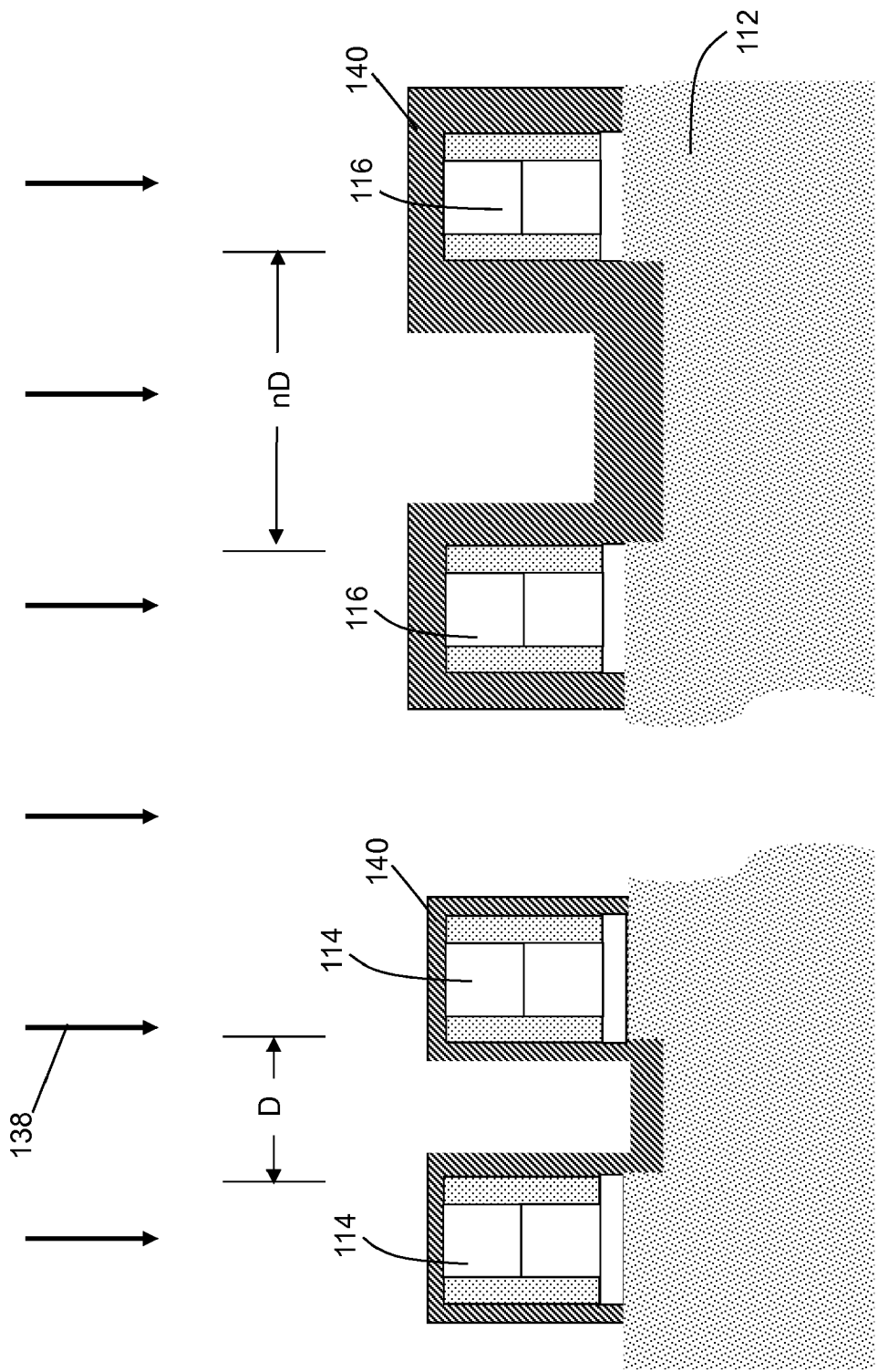
Figure 4:
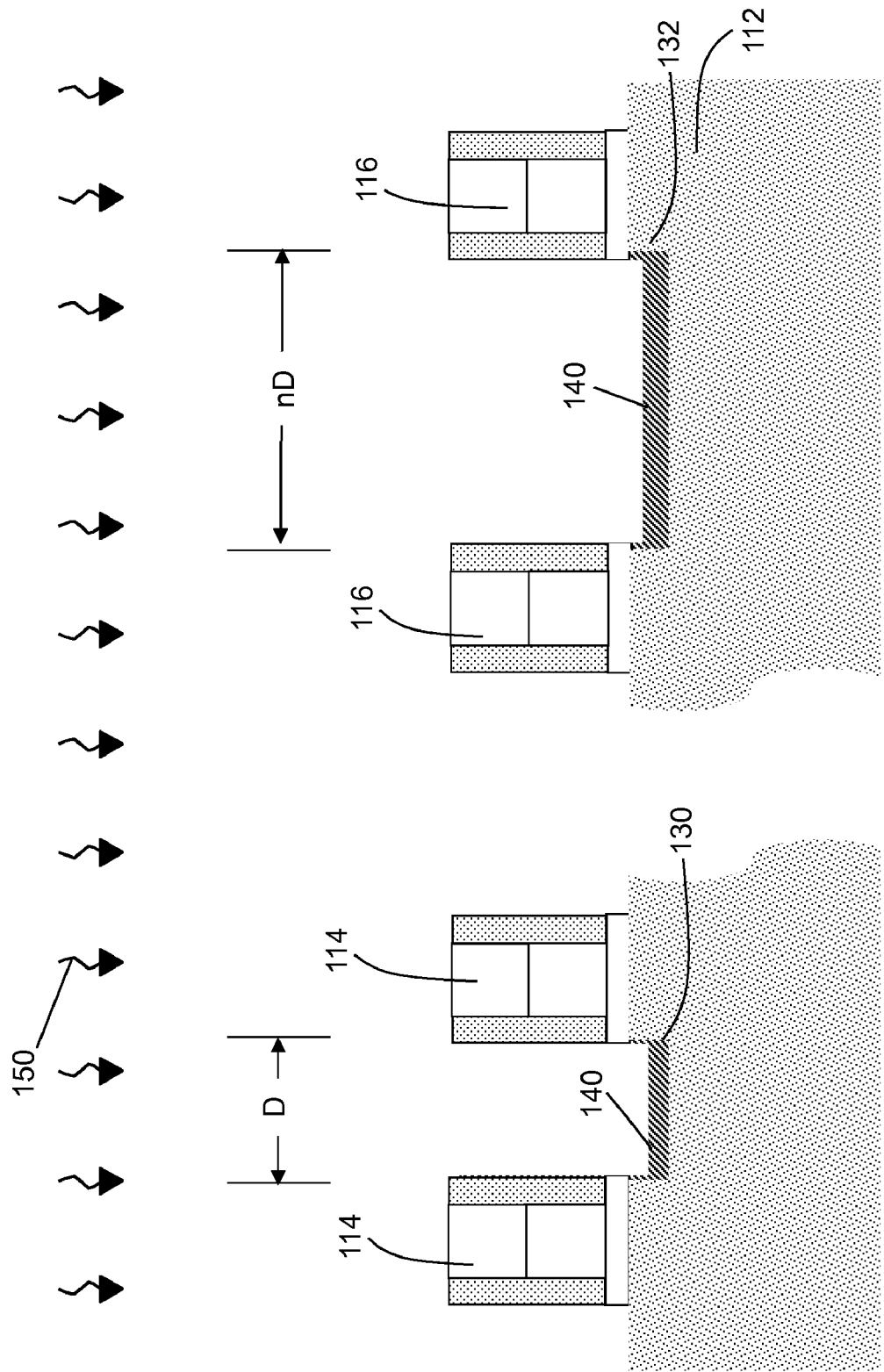

FIGS. 3-4 show cross-sectional views of a first iteratively performed deposition and etch process. In FIG. 3, depositing 138 a first doped epitaxial layer 140 over the semiconductor substrate is illustrated. Epitaxial layer 140 may include any now known or later developed semiconductor material capable of imparting a strain. In any event, first doped epitaxial layer 140 has a first concentration of a dopant. In one embodiment, the dopant includes phosphorous (P) and the first concentration is of the phosphorous. Other dopants such as carbon may also be provided. In one embodiment, the first concentration ranges from approximately $1\times10^{20}$ to approximately $2\times10^{20}$ atoms/cubic centimeters. In another embodiment, the first concentration may be less than approximately $2\times10^{20}$ atoms/cubic centimeters. In one example, epitaxial layer 140 may include silicon doped with phosphorous and carbon (SiCP). Alternatively, epitaxial layer 140 may include silicon doped with arsenic and carbon (SiCAs), and the first concentration is of the arsenic. In another embodiment, the dopant may include antimony (Sb), and the first concentration is of the antimony. In either case, the dopant may further include carbon. As illustrated, first doped epitaxial layer 140 deposits thicker over test structures 116 compared to transistor structures 114, i.e., a higher loading effect occurs over test structures 116. In addition, transistor structures 114 have a lower dopant concentration compared to test structures 116. As will be described in more detail, this loading effect may be due, at least in part, to the level of the dopant.

The "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HD-PCVD), rapid thermal CVD (RTCVD), ultra-high vacuum CVD (UHVCVD), limited reaction processing CVD (LR-PCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIG. 4 shows etching 150 first doped epitaxial layer 140. Etching 150 may include, for example, using a gas phase etching in the epitaxial process chamber using, for example, HCl and/or $Cl_2$, or HBr. As illustrated, etching 150 has a relatively low etching rate over transistor structures 114 compared to test structures 116. The varied etch rate between structures 114, 116 is attributable to the amount of phosphorous present in first doped epitaxial layer 140 over each structure. More specifically, since transistor structures 114 include less phosphorous, layer 140 etches slower over transistor structures 114 compared to test structures 116. That is, the higher the dopant concentration, the higher the etch rate that can be expected. Etching 150 removes a certain thickness of layer 140, leaving it on a bottom and sidewalls of embedded regions 130, 132.

The iterative process shown in FIGS. 3-4 may be performed, for example, 20-30 times to generate first doped epitaxial layer 140 as illustrated.

Figure 5:
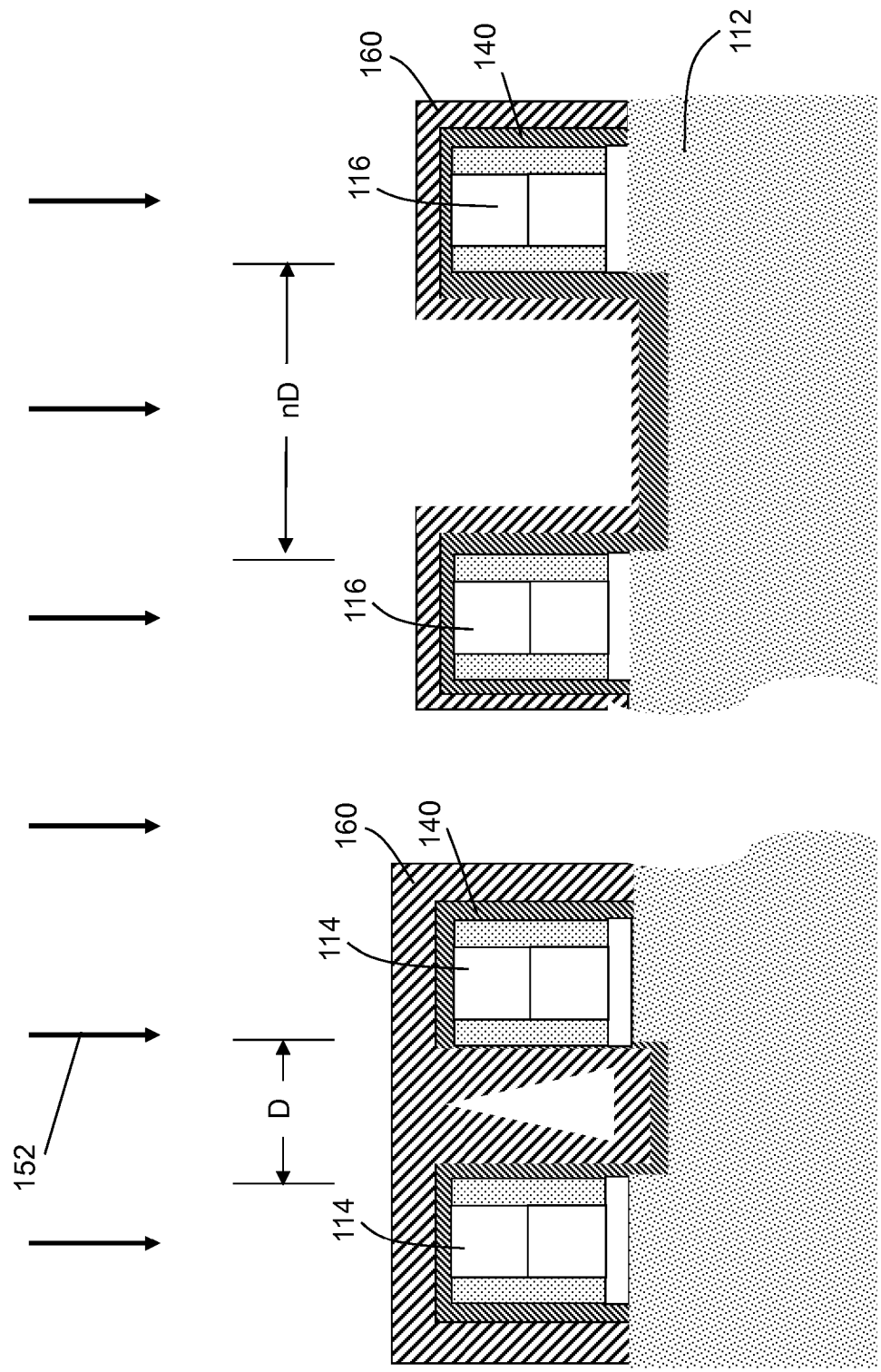
Figure 6:
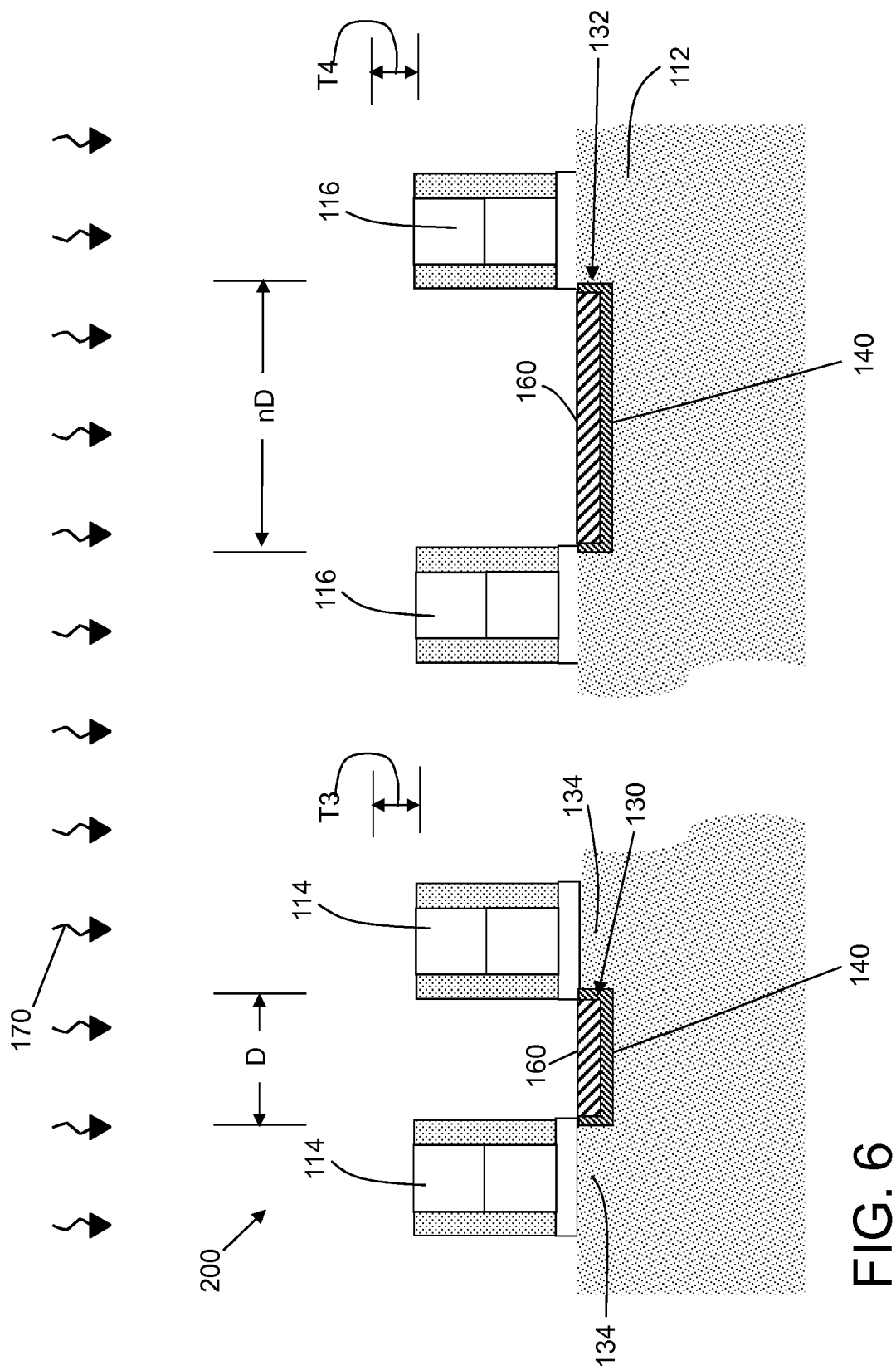

FIGS. 5-6 show cross-sectional views of a second iteratively performed deposition and etch process. In FIG. 5, depositing 152 a second doped epitaxial layer 160 over semiconductor substrate 112 is illustrated. Depositing 152 may include any techniques as described herein. Epitaxial layer 160 may include the same semiconductor material as described above relative to first doped epitaxial layer 140, except second doped epitaxial layer 160 has a second concentration of the dopant (e.g., phosphorous) that is higher than the first concentration. As described above, other dopants may also be provided. In one embodiment, the second concentration may range from approximately $7\times10^{20}$ to approximately $1\times10^{21}$ atoms/cubic centimeters. In another embodiment, the second concentration may be greater than approximately $5\times10^{20}$ atoms/cubic centimeters. As illustrated, second doped epitaxial layer 160 deposits thicker over transistor structures 114 compared to test structures 116, i.e., a higher loading effect occurs over transistor structures 114. This loading effect is due, at least in part, to the higher concentration of the dopant. In addition, transistor structures 114 include less phosphorous than test structures 116 in this case. That is, the higher the dopant concentration, the higher the etch rate that can be expected.

FIG. 6 shows etching 170 second doped epitaxial layer 160. Etching 170 may include, for example, using a gas phase etching in the epitaxial process chamber using, for example, HCl and/or $Cl_2$, or HBr. As illustrated, etching 170 has a relatively low etching rate over test structures 116 compared to transistor structures 114. The varied etch rate between structures 114, 116 is attributable to the amount of phosphorous present in second doped epitaxial layer 160 over each structure. More specifically, since test structures 116 include less phosphorous, layer 160 etches slower over test structures 116 compared to transistor structures 114. Etching 170 removes a certain thickness of layer 160, leaving it over first doped epitaxial layer 140.

The iterative process shown in FIGS. 5-6 may be performed, for example, 20-30 times to generate second doped epitaxial layer 160 as illustrated.

Cumulatively, the impact of the different dopant concentrations in each doped epitaxial layer 140, 160 is that the first concentration results in a first net growth rate over transistor structures 114 and the second concentration results in a lower, second net growth rate over test structures 116 than transistor structures 114. More specifically, depositing 138 of first doped epitaxial layer 140 results in a higher concentration of dopant over test structures 116 than transistor structures 114 resulting in a higher deposition rate over test structures 116 than a deposition rate over transistor structure 114. The higher than normal phosphorous concentration, however, results in a higher etch rate for both structures 114, 116 during etching 150. Deposition of second doped epitaxial layer 160 with a higher concentration results in a higher deposition rate over transistor structures 114 than test structures 116, and a higher concentration over transistor structures 114 compared to test structures 116. Consequently, the etch rate for etching 170 is higher over transistor structures 114 than test structures 116.

Collectively, the phosphorous concentrations provided result in a higher concentration over the larger dimensioned test structures 116, but does not scale as much over the smaller dimensioned transistor structures 114, i.e., epitaxial layers 140, 160 over transistor structures 114 do not have as much phosphorous concentration as test structures 116. The differing concentrations result in a higher etch rate over test structures 116 compared to transistor structures 114 during etchings 150, 170. Consequently, the process provides a generally unchanged growth rate (through entire dep/etch process) on transistor structures 114 and very, very slow growth rate on test structures 116 because the layers 140, 160 etch away faster over test structures 116. As a result, a difference in thickness (i.e., T3-T4) of first and second epitaxial layers 140, 160 together between transistor structures 114 and test structures 116 when completed is no greater than approximately 10%, i.e., of the thickest layer 140, 160. In other words, pattern loading effect is reduced compared to conventional processes. It is also noted that dopant concentration in the resulting epitaxial layers 140, 160 is increased over both structures 114, 116 compared to conventional processes.

FIG. 6 also illustrates a semiconductor structure 200 resulting from the above processes, to which further processes may be applied to arrive at a final product. Semiconductor structure 200 includes a first embedded region 130 between a pair of adjacent transistors 114. First embedded region 130 has a first doped epitaxial layer 140 having a first concentration of a dopant over a bottom and sidewalls of the first embedded region and a second doped epitaxial layer 160 having a second, higher concentration of the dopant over first doped epitaxial layer 140. That is, first doped epitaxial layer 140 covers a bottom and sidewalls of a space, e.g., embedded region 130, between respective transistor structures 114. A second embedded region 132 is positioned between a pair of adjacent test structures 116. Second embedded region 132 has first doped epitaxial layer 140 over the bottom and sidewalls of second embedded region 132 and second doped epitaxial layer 160 over first doped epitaxial layer 140. That is, second doped epitaxial layer 160 covers a bottom and sidewalls of a space, e.g., embedded region 132, between respective test structures 116. As described above, second embedded region 132 is larger than first embedded region 130. Second embedded region 132 may be larger in terms of one or both lateral extents, i.e., across page as shown in FIG. 6 and/or into page as shown in FIG. 6. The embedded regions 130, 132 may also have different depths, but this is not necessary. As noted above, a difference in thickness (i.e, T3-T4) of first and second epitaxial layers 140, 160 together between transistor structures 114 compared to that between test structures 116 is no greater than approximately 10%. As understood, layers 140, 160 may be removed from appropriate areas in subsequent processing.

As also noted above, in one embodiment, the first concentration may range from approximately $1 \times 10^{20}$ to approximately $2 \times 10^{20}$ atoms/cubic centimeters, and the second concentration may range from approximately $7 \times 10^{20}$ to approximately $1 \times 10^{21}$ atoms/cubic centimeters. In a more specific embodiment, the first concentration may be less than approximately $2 \times 10^{20}$ atoms/cubic centimeters, and the second concentration may be greater than approximately $5 \times 10^{20}$ atoms/cubic centimeters. In one embodiment, the dopant includes phosphorous (P) and the first and second concentrations are of the phosphorous.

The above-described processes result in a reduced loading effect during the doped epitaxial layer process. Furthermore, the processes described place a low phosphorous concentration layer 140 closer to a channel region 134 of each transistor structure 114, which aids in minimizing dopant diffusion into channel regions 134. In addition, a higher phosphorous concentration layer 160 is placed at an upper surface where contact silicide (not shown) is provided, which reduces contact resistance. Consequently, the above-described process provides improved electrical performance with reduced pattern loading across semiconductor structure 200.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from cell phones, toys and other low-end applications to advanced computer products having a display, a keyboard or other input device, and a central processor.

The foregoing drawings show some of the processing associated according to several embodiments of this disclosure. In this regard, each drawing represents a process associated with embodiments of the method described. It should also be noted that in some alternative implementations, the acts noted in the drawings may occur out of the order noted or, for example, may in fact be executed substantially concurrently or in the reverse order, depending upon the act involved. Also, one of ordinary skill in the art will recognize that additional drawings that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A semiconductor structure comprising:
   a first embedded region between a pair of adjacent transistor structures, the first embedded region having a first doped epitaxial layer having a first concentration of a dopant over a bottom and sidewalls of the first embedded region and a second doped epitaxial layer having a second, higher concentration of the dopant over the first doped epitaxial layer; and
   a second embedded region between a pair of adjacent test structures, the second embedded region having the first doped epitaxial layer over the bottom and sidewalls of the second embedded region and the second doped epitaxial layer over the first doped epitaxial layer,
   wherein the second embedded region is larger than the first embedded region, and a difference in thickness of the first and second epitaxial layers together between the transistor structures compared to that between the test structures is no greater than approximately 10%.

2. The semiconductor structure of claim 1, wherein the first concentration is less than approximately $2 \times 10^{20}$ atoms/cubic centimeters, and the second concentration is greater than approximately $5 \times 10^{20}$ atoms/cubic centimeters.

3. The semiconductor structure of claim 1, wherein the first concentration ranges from approximately $1 \times 10^{20}$ to approximately $2 \times 10^{20}$ atoms/cubic centimeters, and the second concentration ranges from approximately $7 \times 10^{20}$ to approximately $1 \times 10^{21}$ atoms/cubic centimeters.

4. The semiconductor structure of claim 1, wherein the dopant includes phosphorous (P) and the first and second concentrations are of the phosphorous.

* * * * *